United States Patent
Kim et al.

(10) Patent No.: US 9,305,983 B2
(45) Date of Patent: Apr. 5, 2016

(54) ORGANIC LIGHT EMITTING DISPLAY PANEL AND METHOD OF MANUFACTURING THE SAME

(71) Applicant: LG DISPLAY CO., LTD., Seoul (KR)

(72) Inventors: Kanghyun Kim, Paju-si (KR); KiSoub Yang, Paju-si (KR); SeungRyul Choi, Goyang-si (KR); KyoungJin Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/582,912

(22) Filed: Dec. 24, 2014

(65) Prior Publication Data

US 2016/0071913 A1    Mar. 10, 2016

(30) Foreign Application Priority Data

Sep. 4, 2014  (KR) ........................ 10-2014-0117986

(51) Int. Cl.
*H01L 27/32* (2006.01)
*H01L 51/56* (2006.01)
*H01L 51/00* (2006.01)

(52) U.S. Cl.
CPC ........ *H01L 27/3246* (2013.01); *H01L 51/0004* (2013.01); *H01L 51/56* (2013.01); *H01L 2227/323* (2013.01)

(58) Field of Classification Search
CPC .. H01L 27/3246; H01L 51/56; H01L 51/0004
See application file for complete search history.

(56) References Cited

U.S. PATENT DOCUMENTS

| | | | |
|---|---|---|---|
| 7,037,157 B2 * | 5/2006 | Murakami et al. ............... 445/24 |
| 8,816,341 B2 * | 8/2014 | Kim et al. ........................ 257/40 |
| 2007/0098879 A1 * | 5/2007 | Makiura .......................... 427/66 |
| 2009/0058283 A1 * | 3/2009 | Tanaka et al. .................. 313/504 |
| 2014/0070177 A1 * | 3/2014 | Kim et al. ........................ 257/40 |
| 2014/0147950 A1 * | 5/2014 | Choi et al. ....................... 438/46 |

* cited by examiner

*Primary Examiner* — William Coleman
(74) *Attorney, Agent, or Firm* — Dentons US LLP

(57) ABSTRACT

An organic light emitting display panel according to an aspect of the present invention includes a planarization layer positioned on a substrate including a plurality of pixels, and a first opening portion formed in a non-emission area of the pixel, a first electrode formed on a portion exposed through the first opening portion and the planarization layer, a bank including a portion overlapping an edge of the first electrode, and exposing a portion corresponding to an emission area of the pixel on the first electrode, an organic layer formed on the portion corresponding to the emission area of the pixel on the first electrode, and a second electrode formed on the bank and the organic layer.

11 Claims, 18 Drawing Sheets

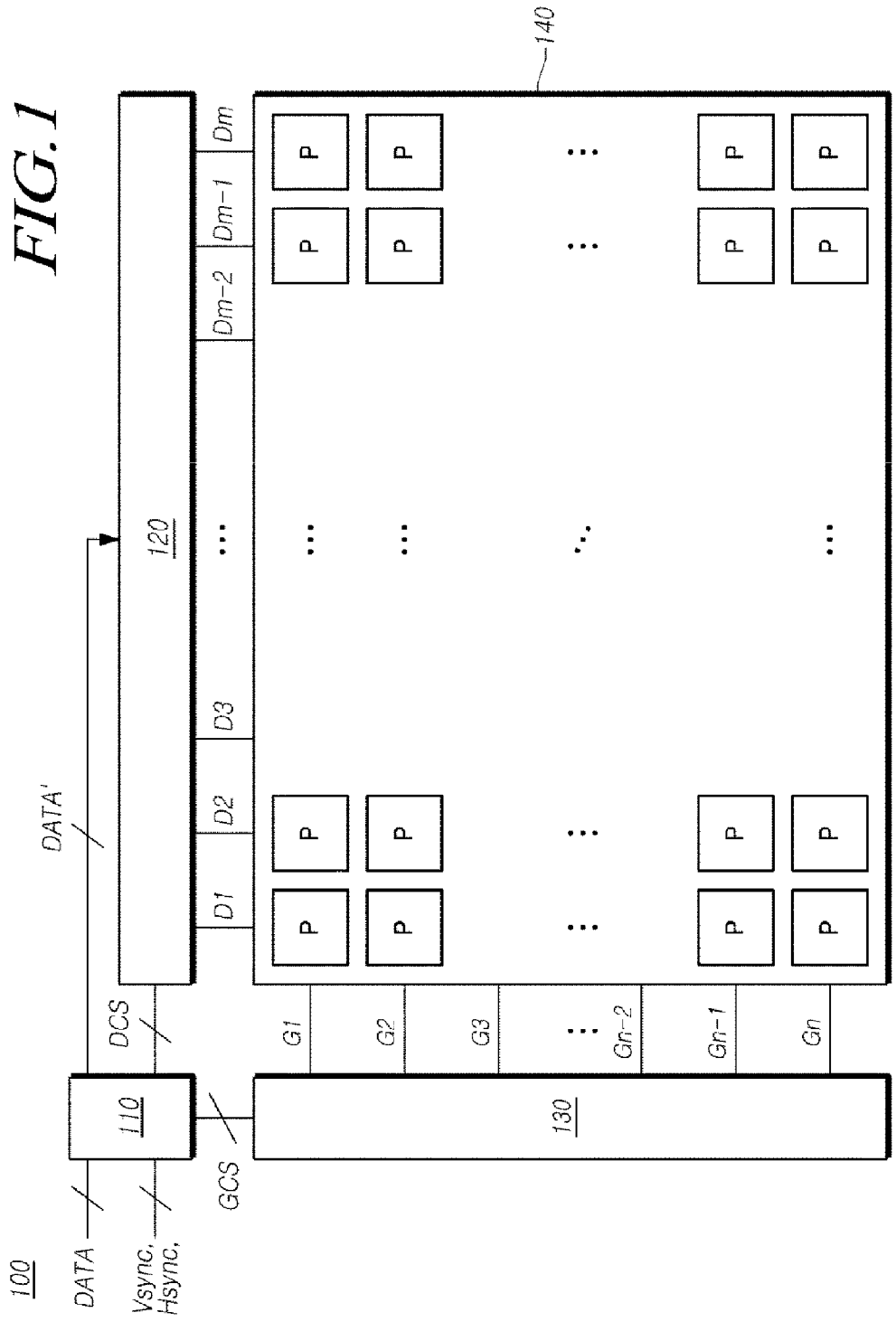

ORGANIC LIGHT EMITTING DISPLAY PANEL AND METHOD OF MANUFACTURING THE SAME

CROSS-REFERENCE TO RELATED APPLICATION

This application claims priority from and the benefit under 35 U.S.C. §119(a) of Korean Patent Application No. 10-2014-0117986, filed on Sep. 4, 2014, which is hereby incorporated by reference for all purposes as if fully set forth herein.

BACKGROUND OF THE INVENTION

1. Field of the Invention

The present invention relates to an organic light emitting display panel and a method of manufacturing the same.

2. Description of the Prior Art

Liquid Crystal Display (LCD) devices, which are lightweight and consume a small amount of power, have been commonly utilized in the fields of flat panel display devices. However, the LCD device is a non-emissive device which does not generate light by itself, and has drawbacks in association with brightness, contrast ratio, viewing angle, enlargement, and the like.

Accordingly, a new flat panel display device that may overcome the drawbacks of the LCD device has been actively researched. An organic light emitting display device, as one of the new flat panel display devices, is a light emitting device that generates light by itself and thus, has excellent brightness, viewing angle, and contrast ratio properties, in comparison with the existing LCD device. Also, the organic light emitting display device does not need a backlight, and thus, the organic light emitting display device may be designed to be lightweight and thin and is advantageous from the perspective of power consumption.

An organic light emitting display panel of the organic light emitting display device displays an image using light emitted from an organic light emitting device connected to a thin film transistor of each pixel area. The light emitting device forms an organic light emitting layer that is formed of organic matter, between an anode and a cathode, and corresponds to a device that generates light by applying an electric field, is driven with a low voltage, consumes a relatively small amount of power, is lightweight, and is manufactured on the top of a flexible substrate.

According to a necessity of an enlargement of the organic light emitting display device, a solution process is being actively developed. Drawbacks in association with visibility characteristic degradation such as luminance degradation and stain occurrence, and also a reduction in lifespan may occur.

SUMMARY OF THE INVENTION

An aspect of the present invention is to provide an organic light emitting display device and a method of manufacturing the same capable of preventing visibility characteristic degradation such as luminance degradation and stain occurrence, and also preventing a reduction in lifespan.

In accordance with an aspect of the present invention, an organic light emitting display panel may include a planarization layer positioned on a substrate including a plurality of pixels, and including a first opening portion formed in a non-emission area of the pixel, a first electrode formed on a portion exposed through the first opening portion and the planarization layer, a bank including a portion overlapping an edge of the first electrode, and exposing a portion corresponding to an emission area of the pixel in the first electrode, an organic layer formed on the portion corresponding to the emission area of the pixel in the first electrode, and a second electrode formed on the bank and the organic layer.

Here, the bank may include a first bank that insulates the first electrode and the second electrode in a non-emission area of the pixel, and a second bank including a second opening portion corresponding to the first opening portion in the non-emission area of the pixel.

In accordance with another aspect of the present invention, a method of manufacturing an organic light emitting display panel may include forming a planarization layer including a first opening portion formed in a non-emission area of a pixel, on a substrate, depositing a first electrode on the planarization layer and a portion exposed through the first opening portion, depositing an inorganic material on the first electrode to form a first bank, spreading a photocurable organic material which is hydrophobic on the first bank, exposing and developing through a mask to expose a portion corresponding to an emission area of the pixel in the first electrode and forming a second bank including a second opening portion corresponding to the first opening portion in the non-emission area of the pixel, printing an organic layer on the portion corresponding to the emission area of the pixel in the first electrode, and depositing a second electrode on the organic layer, the first bank and the second bank.

The present invention can prevent visibility characteristic degradation such as luminance degradation and stain occurrence and prevent a reduction in lifespan.

BRIEF DESCRIPTION OF THE DRAWINGS

The above and other objects, features and advantages of the present invention will be more apparent from the following detailed description taken in conjunction with the accompanying drawings, in which:

FIG. 1 is a system construction diagram related to an organic light emitting display device to which embodiments are applied;

DETAILED DESCRIPTION OF THE EXEMPLARY EMBODIMENTS

Figure 2A:
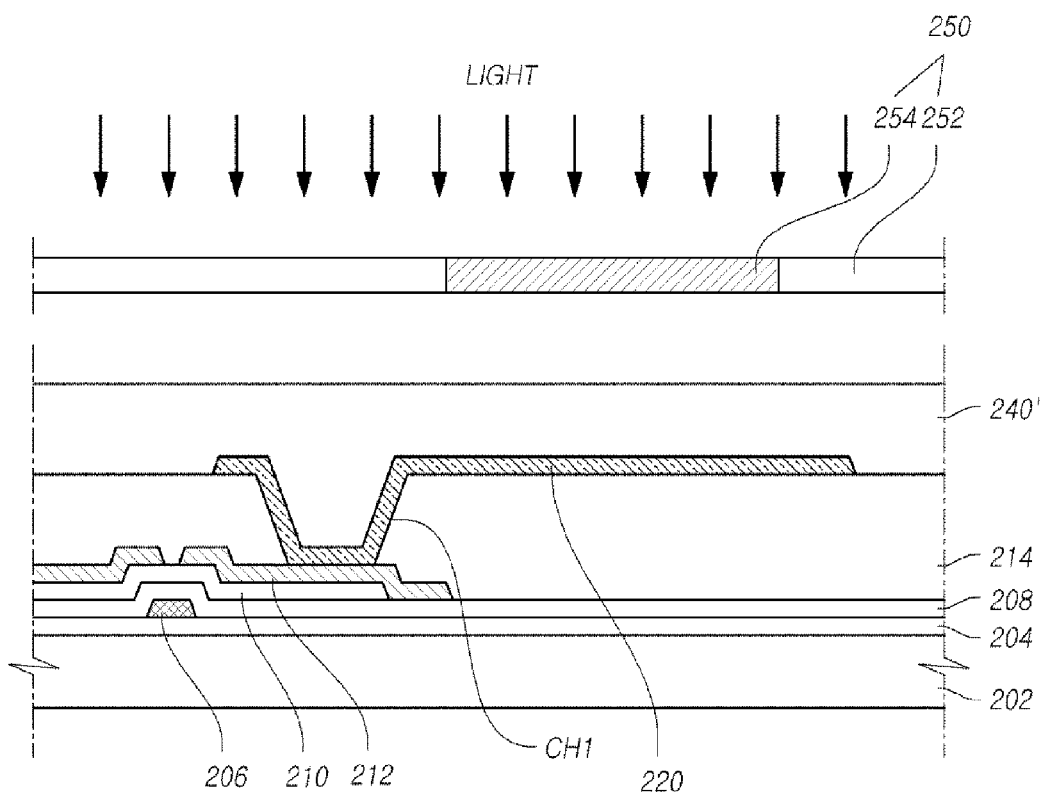
FIGS. 2A and 2B are views illustrating examples of a part of a manufacturing process of a general organic light emitting display panel.

Hereinafter, exemplary embodiments of the present invention will be described with reference to the accompanying drawings. In the following description, the same elements will be designated by the same reference numerals although they are shown in different drawings. Further, in the following description of embodiments of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. These terms are merely used to distinguish one structural element from other structural elements, and a property, an order, a sequence and the like of a corresponding structural element are not limited by the term. It should be noted that if it is described in the specification that one component is "connected," "coupled" or "joined" to another component, a third component may be "connected," "coupled," and "joined" between the first and second components, although the first component may be directly connected, coupled or joined to the second component. Likewise, when it is described that a certain element is formed "on" or "under" another element, it should be understood that the certain element may be formed either directly or indirectly via a still another element on or under another element.

FIG. 1 is a system construction diagram related to an organic light emitting display device to which embodiments are applied.

Referring to FIG. 1, an organic light emitting display device 100 includes an organic light emitting display panel 140, a data driving unit 120, a gate driving unit 130, a timing controller 110, and the like.

The timing controller 110 outputs a data control signal DCS for controlling the data driving unit 120 and a gate control signal GCS for controlling the gate driving unit 130, based on an external timing signal such as horizontal and vertical synchronous signals Vsync and Hsync, image data Data and clock signal CLK input from a host system. Also, the timing controller 110 may convert the image data Data input from the host system into a data signal format that is used in the data driving unit 120 and provide the converted image data Data' to the data driving unit 120.

The data driving unit 120 converts the image data Data' into a data signal (e.g., analog pixel signal or data voltage), which is a voltage value corresponding to a gray scale value to output the converted data signal to data lines D1, D2, . . . , and Dm, in response to the data control signal DCS and the converted image data Data' input from the timing controller 110.

The gate driving unit 130 sequentially supplies a scan signal (i.e., gate pulse, scan pulse, or gate on signal) to gate lines G1, G2, . . . , and GLn in response to the gate control signal GCS input from the timing controller 110.

Meanwhile, each pixel area P on the organic light emitting display panel 140 may be formed in an area defined by the data lines D1, D2, . . . , and Dm and the gate lines G1, G2, . . . , and Gn and may be disposed in a matrix form. Each pixel area P may correspond to at least one organic light emitting diode including an anode which is a first electrode, a cathode which is a second electrode, and an organic layer.

In each pixel area P, the gate lines G1, G2, . . . , and Gn the data lines D1, D2, . . . , and Dm and a high electric potential voltage line for providing a high electronic potential voltage are formed. In addition, in each pixel area P, a switching transistor is formed between the gate lines G1, G2, . . . , and Gn the data lines D1, D2, . . . , and Dm, and a driving transistor is formed between an organic light emitting diode which includes an anode, a cathode and an organic light emitting layer, a source electrode (or a drain electrode) of the switching transistor and the high electric potential voltage line.

Meanwhile, in a bank (not shown) in each pixel P, an opening portion (not shown) is formed in a non-emission area. When a step difference portion such as a contact hole exists on a lower layer of the bank (not shown), the opening portion (not shown) is formed in correspondence to a position of the step difference portion such as the contact hole.

The opening portion (not shown) of the bank (not shown) described above has an effect of uniformly hardening all portions of the bank (not shown), in an exposure process of a manufacturing process of the bank formed of a photocurable material.

Hereinafter, this will be described in more detail with reference to drawings.

Figure 2B:
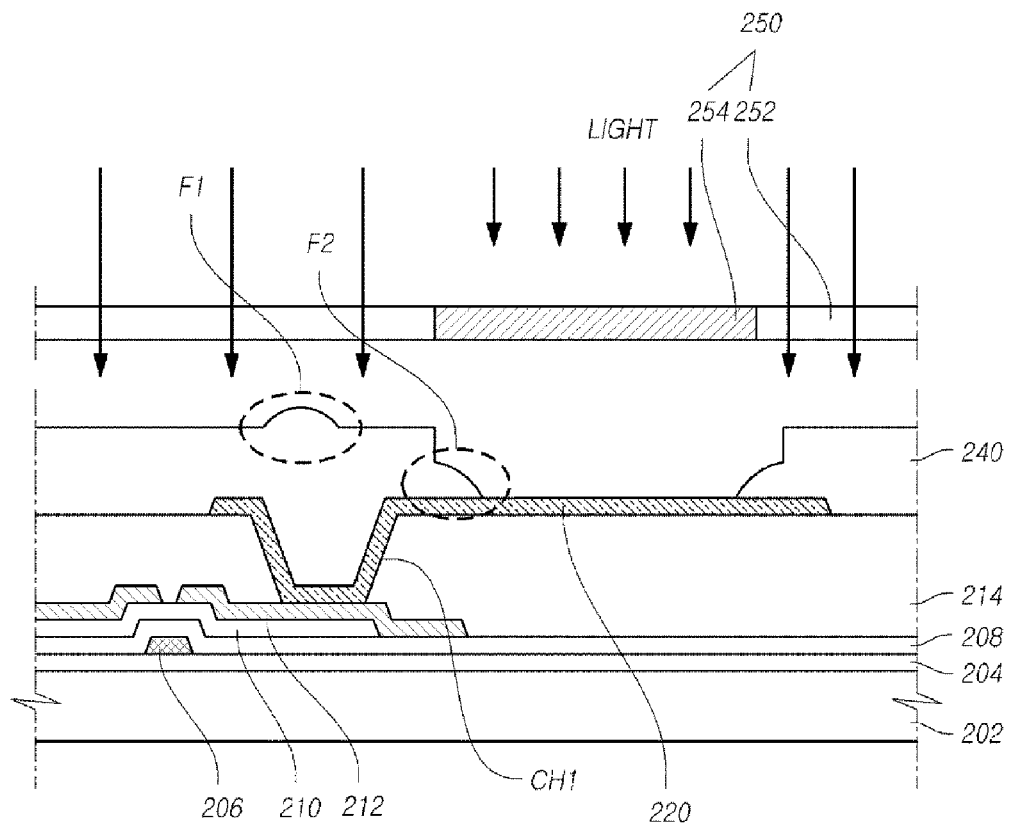
Figure 3:
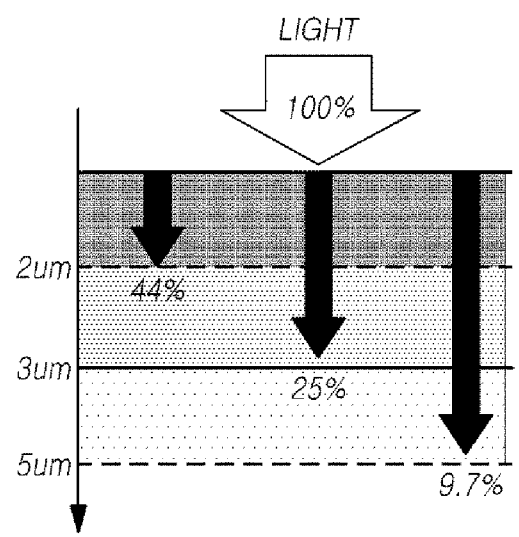
FIG. 3 is a graph illustrating a light transmittance for a height of a bank of an organic light emitting display panel according to embodiments.

FIGS. 2A and 2B are views illustrating examples of a part of a manufacturing process of a general organic light emitting display panel. FIG. 3 is a graph illustrating light transmittance for a height of a bank of an organic light emitting display panel according to embodiments.

Referring to FIGS. 2A and 2B, the general organic light emitting display panel 140 may include a buffer layer 204 formed on a substrate 202, and a transistor formed on the buffer layer 204 and including a gate electrode 206, a semiconductor layer 210 and source/drain electrodes 212. A gate insulating film 208 insulating the gate electrode 206 and the semiconductor layer 210 is formed between the gate electrode 206 and the source/drain electrodes 212. A planarization layer 214 is formed on the source/drain electrodes 212. In addition, a first electrode 220 electrically connected to the source/drain electrodes 212 through a first opening portion CH1 may be formed on the planarization layer 214.

A bank 240 having a portion overlapping an edge of the first electrode 220 and exposing a portion (i.e., area corresponding to an emission area of the pixel P) of the first electrode 220 may be formed on the first electrode 220.

The bank 240 may be formed of an organic material. For example, the bank 240 may be formed of at least one selected from a group including polystyrene, polymethylmetaacrylate (PMMA), polyacrylonitrile (PAN), polyamide, polyimide, polyaryether, heterocyclic polymer, fluorine series high molecule, epoxy resin, benzocyclobutene series resin, siloxane series resin, silane resin and acrylic resin, and a combination thereof.

However, in a manufacturing process of the general organic light emitting display panel 140, a problem may occur in a process of forming the bank 240.

Specifically, as shown in FIG. 2A, after spreading a bank forming material 240' on a first electrode 220, an exposure process is performed. Here, the exposure process may use a mask 250 including a transmitting portion 252 and a blocking portion 254.

In the present specification, the bank forming material 240' means a photocurable organic material 240' which is hydrophobic, and may be referred to as a hydrophobic material 240' or a photocurable organic material 240'.

In the case of the bank 240 of the organic light emitting display panel 140 shown in FIGS. 2A and 2B, as an example, a negative type wherein a portion on which light is emitted is remained on the organic light emitting display panel 140 is illustrated. That is, the bank 240 is formed of a photocurable material of which molecules are linked therein and hardened when the bank forming material 240' is exposed.

Therefore, when light is emitted through the transmitting portion 252 of the mask 250, the bank forming material 240' may be hardened by a photocure reaction. At this time, when a step difference such as a first opening portion CH1 in the bank forming material 240' exists, since a ratio of reached light may be different according to a thickness, non-hardened area may occur.

For example, as shown in FIG. 2B, in the case of the first opening portion CH1, the thickness of the bank forming material 240' may be thicker compared to other areas, and the light may not reach an area adjacent to the first electrode 220 in the first opening portion CH1. Thus, such an area may be the non-hardened area.

Meanwhile, after an exposure process of the bank forming material 240', a development process of the bank 240 is performed. In the development process, the bank forming material 240' of an area corresponding to the blocking portion 254 is eliminated.

In such a development process, when the bank forming material 240' of the portion which is not hardened by the light contacts a developing solution, a gas or fume occurs, and thus the bank 240 may be inflated. That is, in the above-mentioned first opening portion CH1, the bank forming material 240' in the non-hardened area contacts the developing solution, and thus a first defect area F1 may be formed.

When the first defect area F1 occurs, layers formed on the bank 240 are formed in correspondence to a shape of a surface of the bank 240. This may degrade visibility characteristics of the organic light emitting display panel 140, cause a faulty contact condition, and reduce the life of a device.

In addition, when an exposure process is excessively performed so as to eliminate the non-hardened area, the bank forming material 240' may remain in an area corresponding to the blocking portion 254 of the mask 250.

Specifically, when exposure is excessively performed, an amount of light of a slanted path increases, and thus an interference exposure phenomenon may occur. That is, as shown in a second defect area F2 of FIG. 2B, in the area corresponding to the blocking portion 254, a photo cure reaction occurs, and thus the bank forming material 240' may be spreaded on the first electrode 220.

In this case, an opening ratio may be reduced, visibility characteristic degradation such as a stain and luminance degradation may occur, and lifespan of the device may be reduced.

Referring to FIG. 3, FIG. 3 shows a transmittance according to a thickness of a bank 240 formed of an organic material. When the thickness is 5 μm, the light transmittance is only 9.7%. Therefore, when the thickness of the bank forming material 240' is different, a ratio of the reached light becomes different, and thus above-mentioned problems occur.

Hereinafter, an organic light emitting display panel 140 in which such problems are enhanced will be described.

An organic light emitting display panel 140 described below is only an example, the present invention is not limited thereto, and may be formed in various structures and forms.

Figure 4:
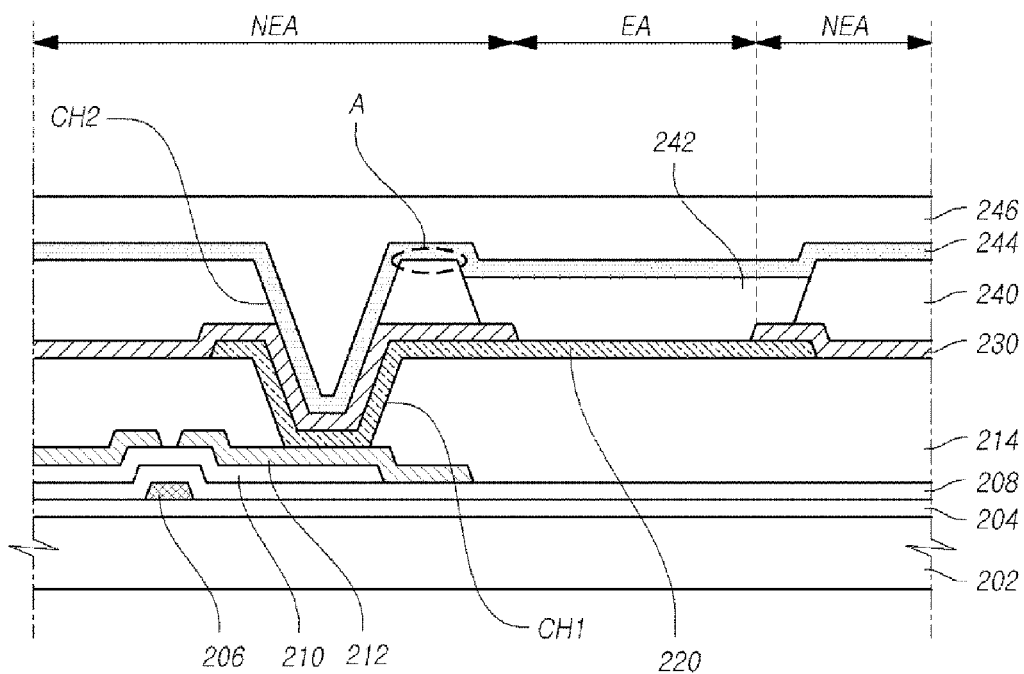
FIG. 4 is a schematic cross-sectional view of an organic light emitting display panel according to an embodiment.

FIG. 4 is a schematic cross-sectional view of an organic light emitting display panel according to an embodiment.

Referring to FIG. 4, an organic light emitting display panel 140 may include a planarization layer 214 positioned on a substrate 202 including a plurality of pixels P and including a first opening portion CH1 formed in a non-emission area NEA of the pixel, a first electrode 220 formed on a portion exposed through the first opening portion CH1 and the planarization layer, banks 230 and 240 including a portion overlapping an edge of the first electrode 220 and exposing a portion corresponding to an emission area EA of the pixel P in the first electrode 220, an organic layer 242 formed on the portion corresponding to the emission area EA of the pixel P on the first electrode 220, and a second electrode 244 formed on the banks 230 and 240 and the organic layer 242.

Here, the banks 230 and 240 may include a first bank 230 that insulates the first electrode 220 and the second electrode 244 in the non-emission area NEA of the pixel P, and a second bank 240 including a second opening portion CH2 corresponding to the first opening portion CH1 in the non-emission area NEA of the pixel P.

The emission area EA of the pixel P means an area on the exposed first electrode 220, and the non-emission area NEA corresponds to an area except for the emission area EA.

Specifically, the organic light emitting display panel 140 may include a buffer layer 204 formed on the substrate 202, and a transistor formed on the buffer layer 204 and include a gate electrode 206, a semiconductor layer 210 and source/drain electrodes 212. A gate insulating film 208 insulating the gate electrode 206 and the semiconductor layer 210 is formed between the gate electrode 206 and the source/drain electrodes 212. A planarization layer 214 is formed on the source/drain electrodes 212. In addition, a first electrode 220 electrically connected to the source/drain electrodes 212 through the first opening portion CH1 may be formed on the planarization layer 214.

The substrate 202 may be a plastic substrate including polyethylene terephthalate (PET), polyethylene naphthalate (PEN), and polyimide, as well as a glass substrate.

The buffer layer 204 for blocking an infiltration of impurities may be formed on the substrate 202. The buffer layer 204 may be formed as a single layer or multiple layers including, for example, silicon nitride (SiNx) or silicon oxide (SiOx).

The gate electrode 206 transfers a gate signal to the transistor. The gate electrode 206 may be formed as a single layer or multiple layers including a metal or an alloy having at least one of Al, Pt, Pd, Ag, Mg, Au, Ni, Nd, Ir, Cr, Li, Ca, Mo, Ti, W and Cu. In addition, the source/drain electrodes 212 electrically connected to the semiconductor layer 210 may be formed of high melting point metal such as chrome (Cr) or tantalum (Ta), but is not limited thereto.

Meanwhile, the semiconductor layer 210 may include metal oxide, for example, may include any of Indium Galium Zinc Oxide (IGZO), Zinc Tin Oxide (ZTO) and Zinc Indium Oxide (ZIO), but is not limited thereto. The semiconductor layer 210 may be formed of amorphous silicon (a-Si) or polysilicon.

The gate insulating film 208 may be formed of an inorganic insulation material such as $SiO_x$, $SiN_x$, SiON, $Al_2O_3$, $TiO_2$, $Ta_2O_5$, $HfO_2$, $ZrO_2$, BST and PZT or may be formed of an organic insulation material including benzocyclobutene (BCB) and acryl series resin or a combination thereof.

The transistor including the gate electrode 206, the semiconductor layer 210 and the source/drain electrodes 212 is illustrated in a bottom gate type as an example, but the present invention is not limited thereto. That is, the transistor may be formed in a top gate type.

The organic light emitting display panel 140 may include other insulating films in addition to the above-mentioned gate insulating film 208.

Meanwhile, the planarization layer 214 may be formed of, for example, at least one of silicon oxynitride (SiON), silicon nitride (SiNx), silicon oxide (SiOx), and aluminum oxide (AlOx) as a hydrogen containing inorganic film with a hydrophobic characteristic, considering a mechanical strength, a water vapor resistance, an ease film formation, productivity and the like.

The first electrode 220 formed on the planarization layer 214 has a relatively high work function value so as to play a role of an anode (i.e., positive) electrode. The first electrode 220 may be formed of a transparent conductive material, for example, may be formed of a metal oxide such as ITO or IZO, an alloy of a metal and an oxide such as ZnO:Al or SnO2:Sb, and a conductive high molecule material such as poly(3-methyl thiophen), Poly(3,4-(Ethylene-1,2-Diauxie Thiophen) (PEDT), polypyrrole and polyaniline. In addition, the pixel electrode 220 may be formed of carbon nano tube, graphene, silver nano wire and the like.

In a case of a top emission, a reflection plate made of a metal material with excellent reflection efficiency, for example, aluminum (Al) or silver (Ag), may be further formed as an auxiliary electrode on upper and lower portions of the first electrode 220 in order to improve the reflection efficiency.

Meanwhile, the banks 230 and 240 may include the first bank 230 and the second bank 240. In a case of the organic light emitting display panel 140 according to an embodiment, the first bank 230 may be formed on the portion corresponding to the non-emission area NEA of the pixel P, and the second bank 240 may be formed on the first bank 230.

Here, the first bank 230 may be formed of an inorganic material, and the second bank 240 may be formed of a photocurable organic material which is hydrophobic.

The first bank 230 may insulate the first electrode 220 and the second electrode 244 in an area where the first opening portion CH1 is formed. This is for preventing an electrical short when the first electrode 220 and the second electrode 244 meet.

In addition, the first bank 230 may be formed by depositing and etching an inorganic material.

Meanwhile, the second bank 240 is a partition wall defining the emission area EA of the pixel P, may be formed of an organic material which is hydrophobic, and may be a photocurable material proper in a process of a negative type. For example, the second bank 240 may be formed of photo acryl resin or polyimide series material.

The second bank 240 is hydrophobic. Therefore, the second bank 240 may enable the organic layer 242 formed by a solution process to be uniformly spread in the emission area EA and enable the organic layer 242 not to overflow into the non-emission area NEA.

The second bank 240 may be formed of a material that is hydrophobic. Alternatively, a material which is hydrophobic may be formed on the second bank 240. This will be described with reference to FIGS. 7A to 7C.

In addition, the second bank 240 may be formed of a photocurable material of which molecules are linked by an exposure, and may include a second opening portion CH2 corresponding to the first opening portion CH1 of the planarization layer 214 in the non-emission area NEA.

The first opening portion CH1 may be a structure for connecting the first electrode 220 with the source/drain electrodes 212 of the transistor, but the present invention is not limited thereto, and may mean other portions where a step difference is formed in the non-emission area NEA.

The second opening portion CH2 prevents an occurrence of an area which is not hardened by light according to a thickness, in a manufacturing process of the banks 230 and 240, which includes an exposure process and a development process. That is, the second opening portion CH2 is formed even in the second bank 240 positioned on the planarization layer 214, in correspondence to an area where a step difference exists in the planarization layer 214, and thus a thickness of the second bank 240 may be uniform. Therefore, a visibility characteristic degradation and a lifetime reduction according to the occurrence of the non-hardened area can be prevented.

Meanwhile, on the first electrode 220, the organic layer 242 may be formed in the emission area EA defined by the first bank 230 and the second bank 240. The organic layer 242 may be formed as a multi-layer structure including at least one layer, and at least one layer in the organic layer 242 may be formed by a solution process.

In the organic layer 242, a Hole Injection Layer (HIL), a Hole Transfer Layer (HTL), an Emitting Layer (EL), an Electron Transfer Layer (ETL), an Electron Injection Layer (EIL), and the like may be sequentially laminated so that a hole and an electron are smoothly transferred to form an exciton.

The organic layer 242 may be formed by a solution process, and for example, may be formed by an inkjet printing process. The organic layer 242 may be formed of a high molecule material suitable for the solution process, but is not limited thereto.

The organic layer 242 in each pixel P of the organic light emitting display panel 140 may be formed by, for example, an RGB scheme which emits red, green and blue, but is not limited thereto.

In addition, in the organic layer 242, for example, the HIL, the HTL and the EL may be formed by the solution process, and the ETL and EIL may be formed by a deposition process.

An ink may include a solvent and a solid matter remained after the solvent is dried, and may have hydrophilicity. In contrast, since the second bank 240 is hydrophobic, the ink may not spread to the non-emission area NEA.

Meanwhile, in a case of the organic layer 242 formed by the solution process, a thickness of a central area surrounded by the banks 230 and 240 may be thicker than a thickness of an edge area adjacent to the banks 230 and 240. Therefore, a stain in which an area adjacent to the banks 230 and 240 is dark may occur.

However, an organic material is collected to the central area of the emission area EA of the pixel P by the first bank 230 positioned at a lower layer compared to the second bank 240, and thus the thickness of the organic layer 242 in the area adjacent to the banks 230 and 240 may be reduced.

Meanwhile, a second electrode 244 may be formed on the banks 230 and 240 and the organic layer 242. The second electrode 244 may be a cathode (i.e., negative) electrode, and may be formed of a material of which a work function is relatively low. In a case of the bottom emission scheme, for example, the second electrode 244 may be a metal having a high reflectance, and may be a monolayer or multiple layers of an alloy in which a first metal, for example, silver (Ag), and a second metal, for example, magnesium, are mixed in a predetermined proportion.

The protection layer 246 may be formed of a metal thin film, may be a structure using a frit, but is not limited thereto, and may be formed by various schemes.

Hereinafter, descriptions in association with element the same as the elements of the above-mentioned organic light emitting display panel 140 will be omitted.

Figure 5:
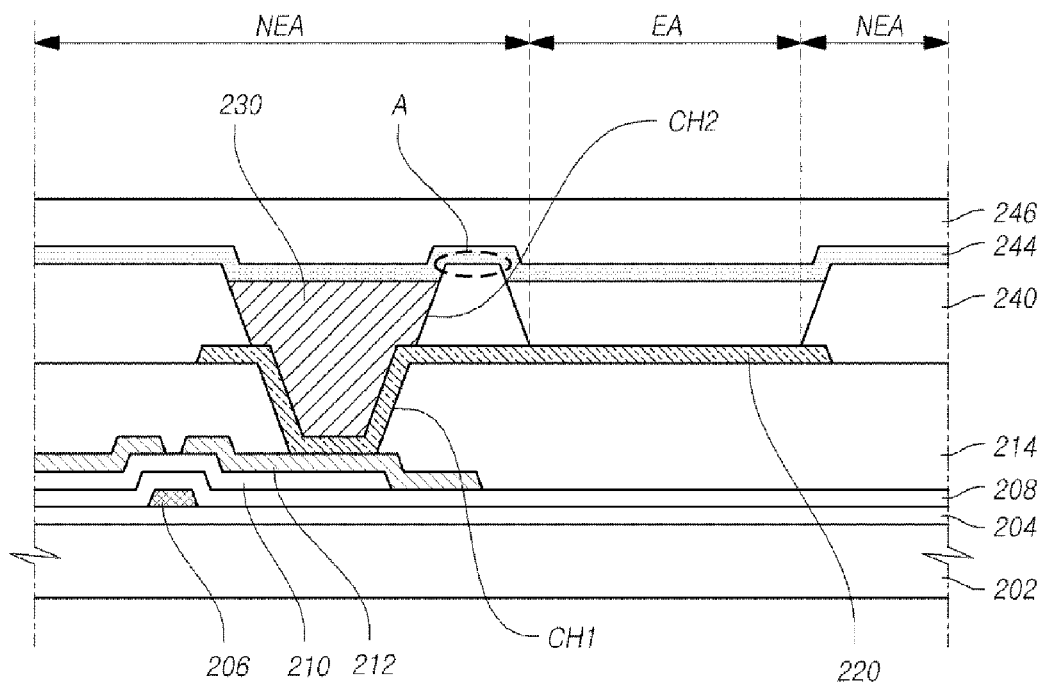
FIG. 5 is a schematic cross-sectional view of an organic light emitting display panel according to another embodiment.

FIG. 5 is a schematic cross-sectional view of an organic light emitting display panel according to another embodiment.

Referring to FIG. 5, the organic light emitting display panel 140 may include a planarization layer 214 formed on a transistor and including a first opening portion CH1 formed in the non-emission area NEA, and a first electrode 220 electrically connected to source/drain electrodes 212 of the transistor through the first opening portion CH1. In addition, the organic light emitting display panel 140 may include a second bank 240 including a second opening portion CH2 overlapping and corresponding to the first opening portion CH1 in the non-emission area NEA, and a first bank 230 formed in a portion exposed by the first opening portion CH1 and the second opening portion CH2.

As described above, a position of the first opening portion CH1 is only an example for convenience of description, the first opening portion CH1 may be formed in other areas of the non-emission area NEA of the organic light emitting display panel 140. The second opening portion CH2 is formed in correspondence to the position of the first opening portion CH1.

Here, the first bank 230 may be formed of a thermosetting organic material, and the second bank 240 may be formed of a photocurable organic material which is hydrophobic. In addition, the first bank 230 may be formed by a solution process.

The first bank 230 insulates between the first electrode 220 and the second electrode 244 in an area where the first opening portion CH1 and the second opening portion CH2 are formed. The thickness of the first bank 230 is not limited to the thickness shown in FIG. 5, and the first bank 230 may be variously formed.

In addition, the first bank 230 may be formed by a solution process, for example, an inkjet printing, but is not limited thereto. Therefore, in a case of the organic light emitting display panel 140 according to the another embodiment, since a deposition process and an etching process of an inorganic material layer are removed, a process time can be reduced and a cost according to a use of an inorganic material layer can be reduced.

The first bank 230 may be formed of a thermosetting organic material, but is not limited thereto. Thus, characteristics such as a heat resistance, a solvent resistance, a chemical resistance, a mechanical property and an electrical insulation can be improved. Especially, the first bank 230 formed of the thermosetting organic material effectively insulates between the first electrode 220 and the second electrode 244.

Meanwhile, the second bank 240 is formed of a photocurable organic material which is hydrophobic. Alternatively, a hydrophobic process is performed on the second bank 240. Therefore, the second bank 240 may play a role of a partition wall which prevents an overflow of an organic solution (e.g., material forming the organic layer 242) having hydrophilicity into an non-emission area.

If the first bank 230 only insulates the first electrode 220 and the second electrode 244, the first bank 230 is not limited to an embodiment shown in FIGS. 4 and 5, and may be variously formed.

In addition, if the second bank 240 only plays a role of the partition wall which is hydrophobic, the second bank 240 may be formed in various forms and may be formed of various materials.

Figure 6:
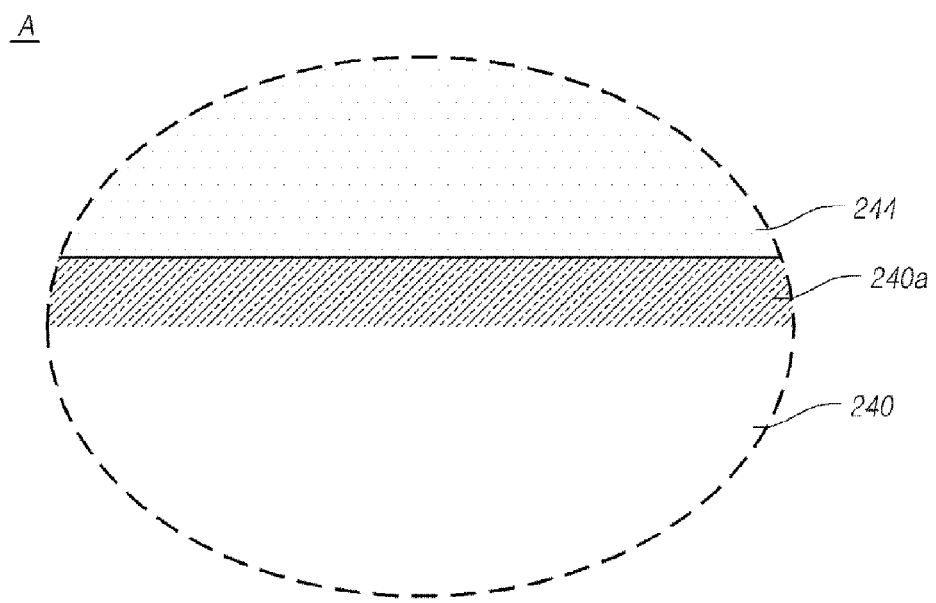
FIG. 6 is an enlarged cross-sectional view illustrating an area A of FIGS. 4 and 5.

FIG. 6 is an enlarged cross-sectional view illustrating an area A of FIGS. 4 and 5.

FIG. 6 illustrates the area A of the second bank 240 in the organic light emitting display panel 140 shown in FIG. 5. The area A means the second bank 240 in a case wherein a hydrophobic process is performed on the second bank 240.

Referring to FIG. 6, a hydrophobic material 240a may be linked and positioned on the second bank 240. The upper portion of the second bank 240, in which the hydrophobic process is performed may prevent a spreadability of an organic solution to the non-emission area NEA when the organic solution which is hydrophilic is printed.

The hydrophobic process will be described below.

Figure 7:
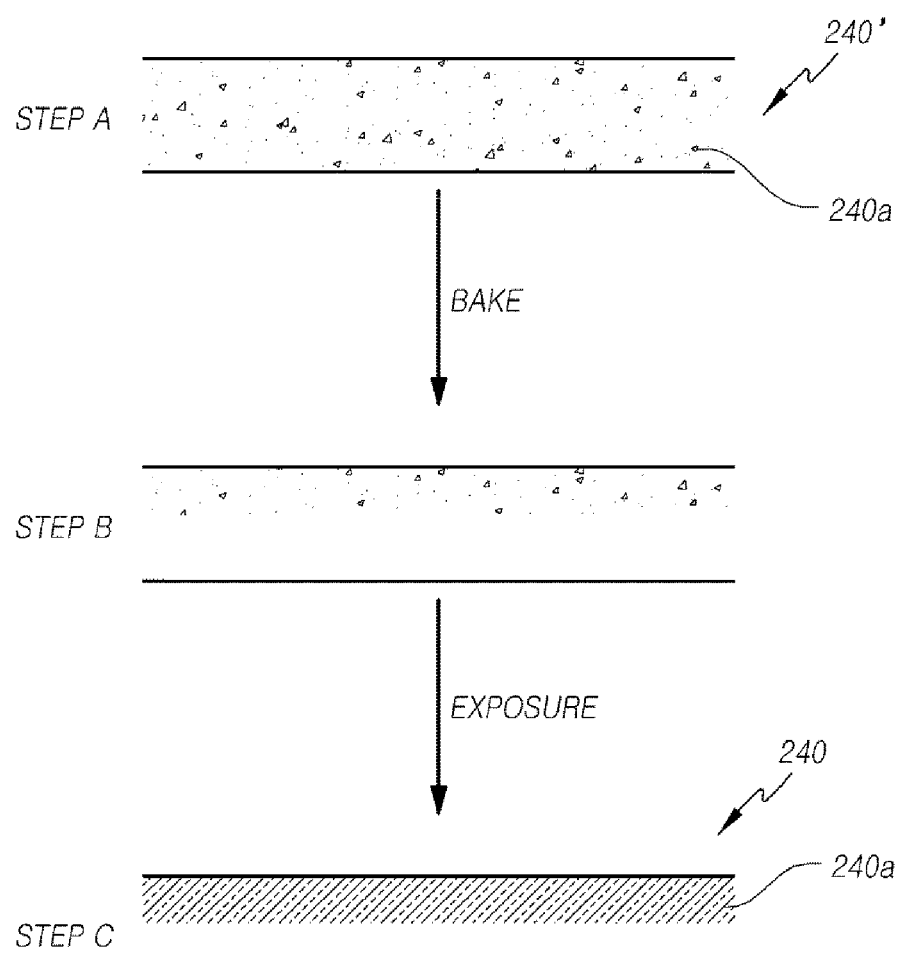
FIG. 7 illustrates an example of a part among processes forming a bank of an organic light emitting display panel according to still another embodiment.

FIG. 7 illustrates views of an example of a part of the process for forming a bank of an organic light emitting display panel according to still another embodiment.

Referring to FIG. 7, Step A, a bank forming material 240' may be spread on a lower layer, and the bank forming material 240' may include a hydrophobic material 240a.

The bank forming material 240' may be, for example, photo acryl series of resin or polyimide series of material. A hydrophobic material 240a may be fluorene, but is not limited thereto.

The lower layer of the bank forming material 240' may be, for example, an organic insulating film or an inorganic insulating film, but is not limited thereto.

When a bake process is performed on the above-mentioned bank forming material 240' (Step B), the hydrophobic material 240a is moved to an upper portion of the bank forming material 240'. When an exposure process (Step C) is performed on the bank forming material 240', molecules forming the bank forming material 240' may be linked by light and the hydrophobic material 240a may be also linked.

According to such a process, the hydrophobic process may be performed on the second bank 240, and thus the second bank 240 on which the hydrophobic process is performed may play a role of a partition wall for an organic solution.

Hereinafter, a method of manufacturing an organic light emitting display panel according to embodiments and an effect thereof will be described with reference to drawings.

FIGS. 8A to 8F are views illustrating a method of manufacturing an organic light emitting display panel according to still another embodiment.

Referring to FIGS. 8A to 8F, the method of manufacturing the organic light emitting display panel 140 may include forming a planarization layer 214 including a first opening portion CH1 formed in a non-emission area of a pixel, on a substrate 202, depositing a first electrode 220 on the planarization layer 214 and a portion exposed through the first opening portion CH1, depositing an inorganic material on the first electrode 220 to form a first bank 230, spreading a photocurable organic material 240' which is hydrophobic on the first bank 230, exposing and developing through a mask to expose a portion corresponding to an emission area EA of the pixel P in the first electrode 220 and forming a second bank 240 including a second opening portion CH2 corresponding to the first opening portion CH1 in the non-emission area NEA of the pixel P, printing an organic layer 242 on the portion corresponding to the emission area EA of the pixel P in the first electrode 220, and depositing a second electrode 244 on the organic layer 242, the first bank 230 and the second bank 240.

Figure 8A:
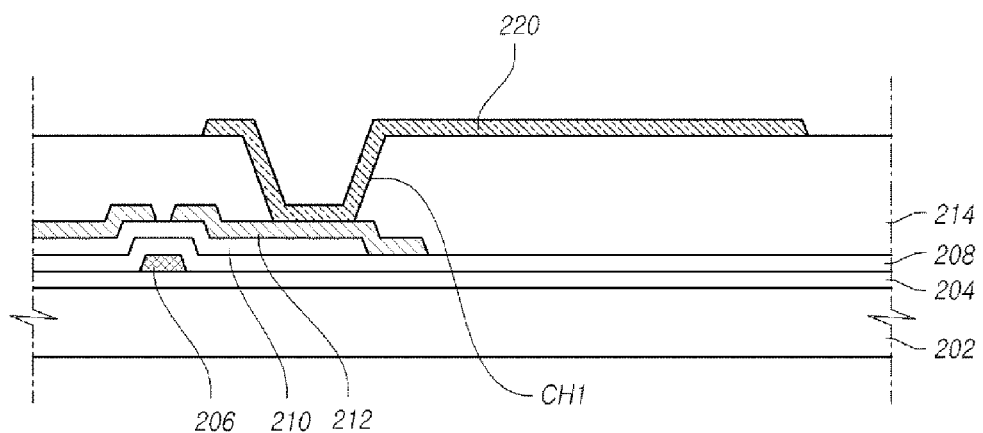
FIGS. 8A to 8F are views illustrating a method of manufacturing an organic light emitting display panel according to still another embodiment.

As shown in FIG. 8A, the planarization layer 214 including the first opening portion CH1 is formed and the first electrode 220 is deposited on the planarization layer 214. The planarization layer 214 may be formed by a Chemical Vapor Deposition (CVD) process or a Physical Vapor Deposition (PVD) process. In addition, the first opening portion CH1 may be formed by a photolithography process using a light mask.

The first electrode 220 may be also deposited by a CVD or a PVD, and may be patterned through a photolithography process.

Figure 8B:
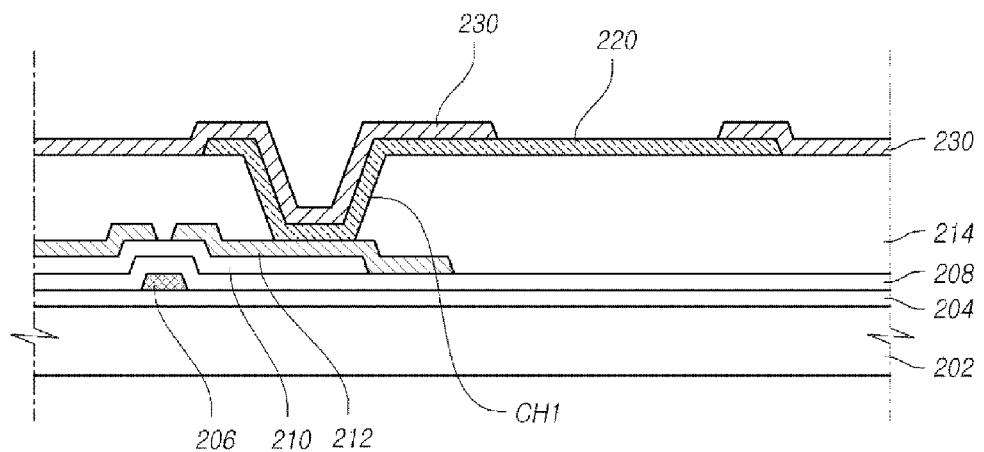

FIG. 8B illustrates forming the first bank 230 formed of an inorganic material. The first bank 230 may be deposited by a CVD or a PVD, and may be patterned through a photolithography process. The first bank 230 insulates the first electrode 220 and the second bank in an area where the first opening portion CH1 is formed to prevent an electrical short.

In addition, the first bank 230 may prevent a phenomenon in which a thickness of the organic layer 242 becomes thicker, in an area adjacent to the banks 230 and 240, by enabling an organic layer material to be collected to a central area of the emission area EA of the pixel P.

Figure 8C:
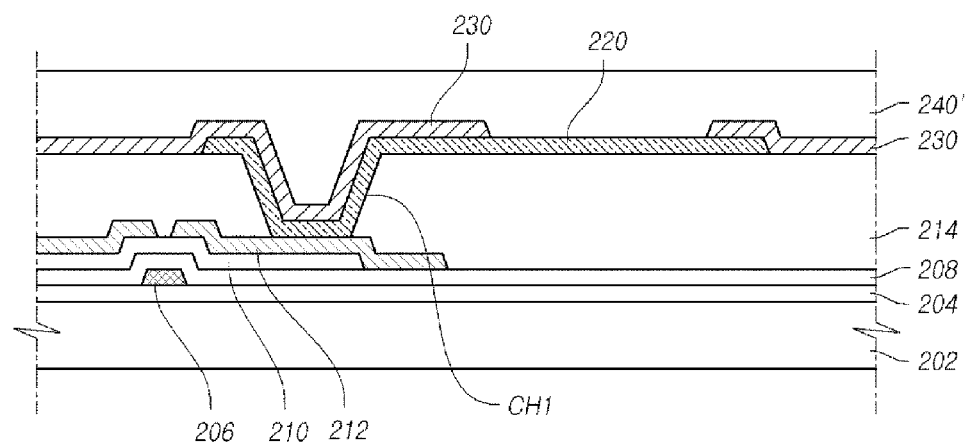

Next, as shown in FIG. 8C, a photocurable organic material 240' which is hydrophobic is spread on the first bank 230.

The photocurable organic material 240' which is hydrophobic may be any of, for example, styrene, methyl mathacrylate, polytetrafluoroethylene, or a combination thereof. Alternatively, as described above, the hydrophobic process may be performed on the first bank 230. The photocurable organic material 240' which is hydrophobic may be referred to as the bank forming material 240'.

Figure 8D:
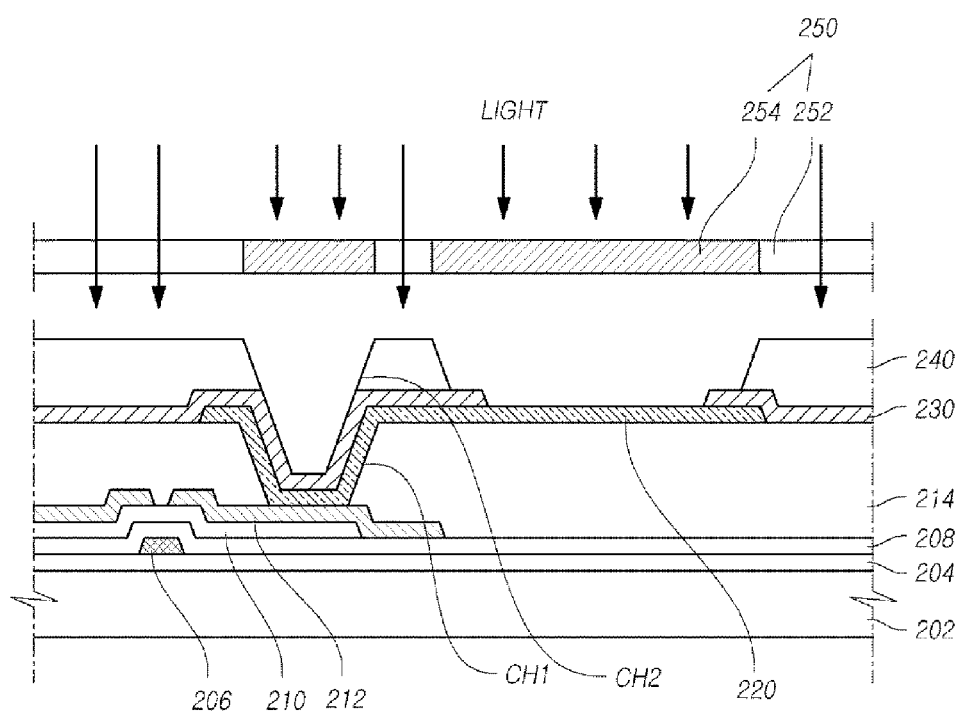

Next, referring to FIG. 8D, the exposure process and the development process are performed through the mask 250, the portion corresponding to the emission area EA of the pixel P in the first electrode 220 is exposed, and the second bank 240 in which the second opening portion CH2 is formed corresponding to the first opening portion CH1 in the non-emission area NEA of the pixel P is formed.

In FIG. 8D, a negative type in which a portion receiving light remains after the development in the photocurable organic material 240' is illustrated as an example. In addition, the mask 250 may include a transmitting portion 252 in which light transmits and a blocking portion 254 in which the light is blocked.

The second bank 240 is formed of a hydrophobic material. Alternatively, a hydrophobic process is performed on the second bank 240. Thus, the second bank 240 may play a role of a partition wall for an organic solution which is hydrophilic.

Meanwhile, the second opening portion CH2 is formed in correspondence to the first opening portion CH1, and has an effect of uniformly maintaining a thickness of the second bank 240. That is, the second opening portion CH2 prevents an occurrence of a non-hardened area with respect to a photocuring reaction, and thus prevents a visibility characteristic degradation and a lifetime reduction.

Figure 8E:
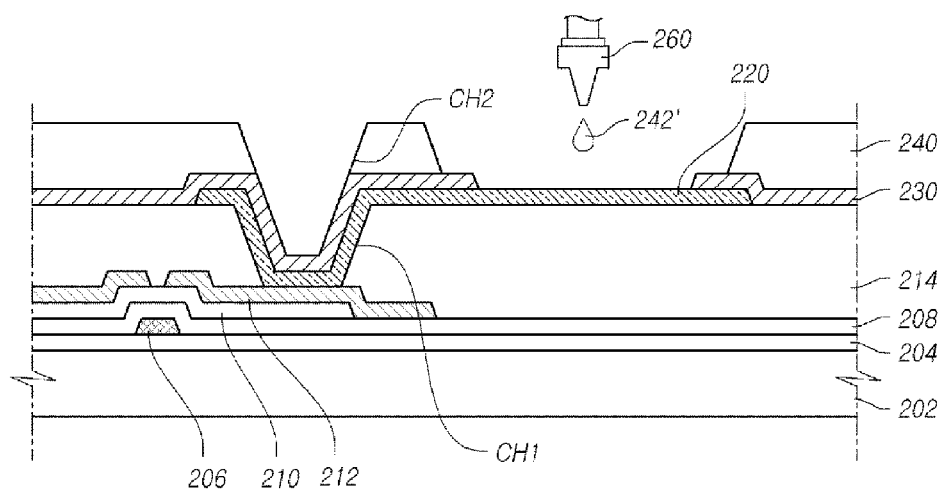

FIG. 8E illustrates a forming process of the organic layer 242. A scheme shown in FIG. 8E is an inkjet printing, this is illustrated as an example for convenience of description, and the present invention is not limited thereto.

An organic solution 242' including a solvent and a solid matter is dropped from an inkjet head 260 and spread to the banks 230 and 240, is dried by heat, and thus the organic layer 242 is formed. At this time, the first bank 230 may enable the organic layer 242 to be dried in a uniform thickness.

Figure 8F:
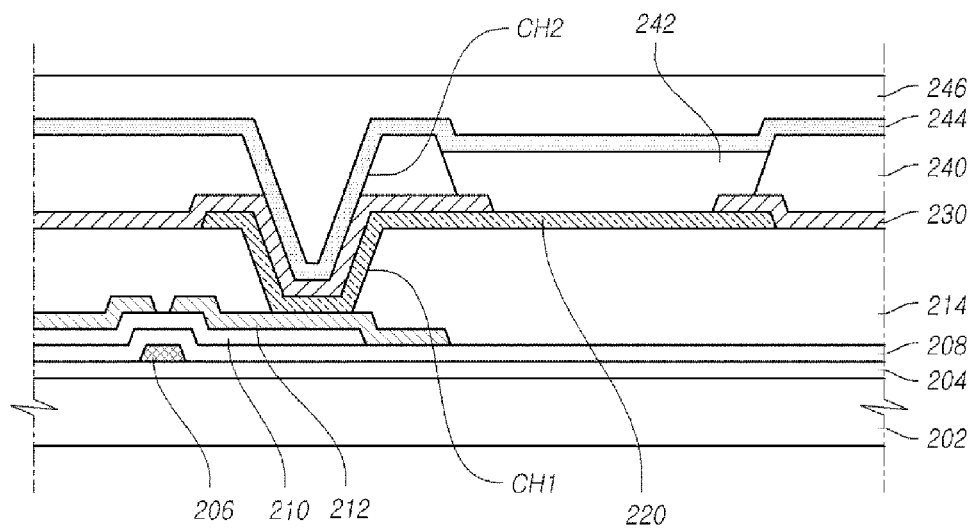

Next, the second electrode 244 is deposited, a protection layer 246 is formed, and thus the organic light emitting display panel 140 shown in FIG. 8F may be manufactured.

FIGS. 9A to 9D are views illustrating a method of manufacturing an organic light emitting display panel according to still another embodiment.

Referring to FIGS. 9A to 9D, forming a planarization layer 214 including a first opening portion CH1 formed in a non-emission area NEA of a pixel P, on a substrate 202, depositing a first electrode 220 on the planarization layer 214 and a portion exposed through the first opening portion CH1, spreading a photocurable organic material which is hydrophobic on the first electrode 220, exposing and developing through a mask 250 to expose a portion corresponding to an emission area EA of the pixel P in the first electrode 220 and forming a second bank 240 including a second opening portion CH2 corresponding to the first opening portion CH1 in the non-emission area NEA of the pixel P, printing an organic layer 242 on the portion corresponding to the emission area EA of the pixel P in the first electrode 220, printing a first bank 230 on a portion exposed through the first opening portion CH1 and the second opening portion CH2, and depositing a second electrode 244 on the organic layer 242, the first bank 230 and the second bank 240.

Here, a sequence of the printing the organic layer 242 on the portion corresponding to the emission area EA of the pixel P in the first electrode 220, and the printing the first bank 230 on the portion exposed through the first opening portion CH1 and the second opening portion CH2 may be randomly changed.

Hereinafter, descriptions the same as the descriptions described in association with FIGS. 8A to 8F will be omitted.

Figure 9A:
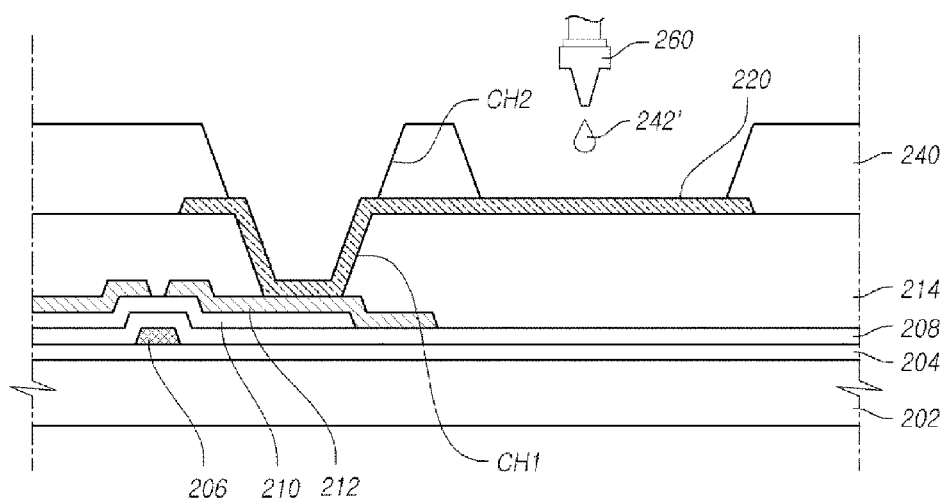
FIGS. 9A to 9D are views illustrating a method of manufacturing an organic light emitting display panel according to still another embodiment.

Referring to FIG. 9A, the planarization layer 214 including the first opening portion CH1 positioned in the non-emission area NEA may be formed, the first electrode 220 may be deposited on the planarization layer 214, and the second bank 240 including the second opening portion CH2 may be formed using the mask 250. Next, an organic solution 242' is dropped on the first electrode 220 of the emission area EA through an inkjet printing, and the organic solution 242' is dried.

Figure 9B:
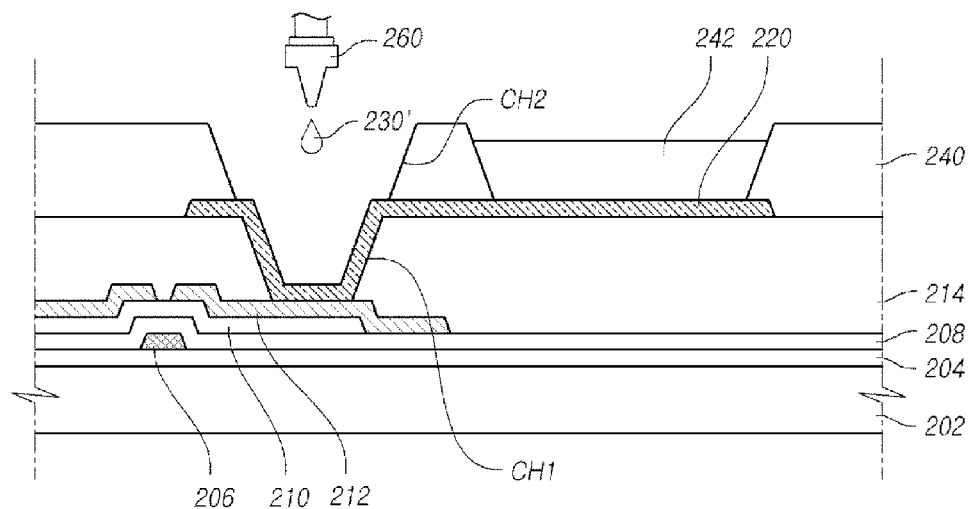
Figure 9C:
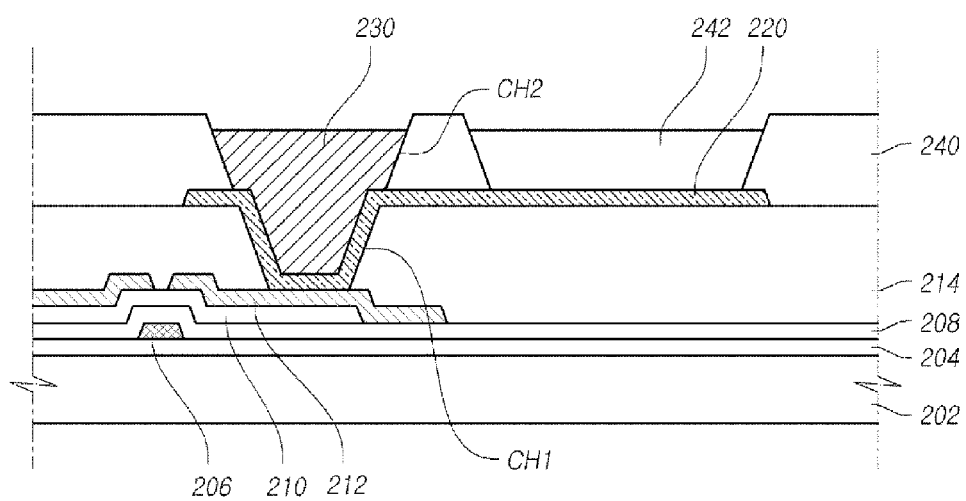

Next, as shown in FIGS. 9B and 9C, the first bank 230 may be formed by the inkjet printing. A first bank forming material 230' is dropped through an inkjet head 260, and the first bank forming material 230' is dried.

Here, the first bank 230 may be formed of an organic insulating material, and insulates between the first electrode 220 and the second electrode 244.

In this case, since a deposition process of the first bank 230 and a patterning process by an etching are removed, a process time can be reduced and a manufacturing cost can be reduced.

The process of forming the first bank 230 by the inkjet printing is for convenience of description, the present invention is not limited thereto, and the first bank 230 may be formed by various solution processes.

Figure 9D:
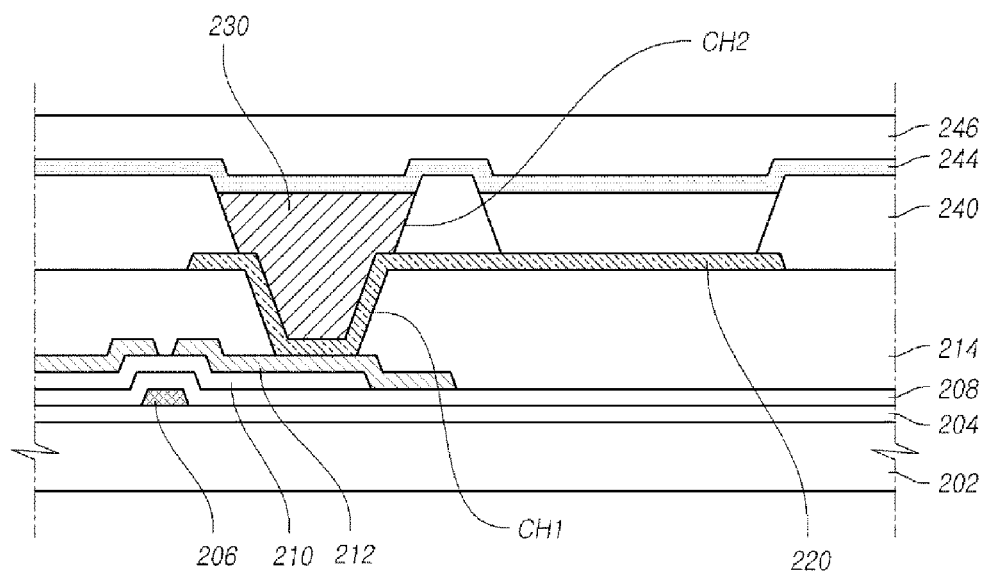

Next, as shown in FIG. 9D, the second electrode 244 is deposited on a whole surface, a protection layer 246 is formed, and thus the organic light emitting display panel 140 may be manufactured.

Hereinafter, an effect of the present invention is summarized.

In an organic light emitting display panel 140 forming an organic layer 242 by a solution process, when banks 230 and 240 formed of a photocurable material are formed, since a non-hardened area due to a step difference occurs, a gas and the like are formed, and thus drawbacks in association with a visibility characteristic degradation such as a luminance degradation or a stain occurrence and a reduction of a device lifetime may occur.

An organic light emitting display panel 140 according to the present invention forms a second opening portion CH2 in correspondence to the first opening portion CH1 formed in a planarization layer 214, and thus prevents an occurrence of a non-hardened area. In addition, in order to prevent an electrical short between the first electrode 220 and the second electrode 244, the first bank 230 is formed, and thus the first bank 230 may insulate the first electrode 220 and the second electrode 244.

The first bank 230 may be formed under the second bank 240 by a deposition process, or may be formed by a solution process in an area where the first opening portion CH1 and the second opening portion CH2 are formed. When the first bank 230 is formed by a solution process, since a deposition process and a patterning process are omitted, a manufacturing cost can be reduced and a process time can be shorted.

Although various embodiments have been described up to now with reference to the accompanying drawings, the present invention is not limited to them.

Further, the terms "includes", "constitutes", or "has" mentioned above mean that a corresponding structural element is included unless they have no reverse meaning. Accordingly, it should be interpreted that the terms may not exclude but further include other structural elements. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

Although the embodiments of the present invention have been described for illustrative purposes, those skilled in the art will appreciate that various modifications, additions and substitutions are possible, without departing from the scope and spirit of the invention. Accordingly, the embodiments disclosed in the present invention are merely to not limit but describe the technical spirit of the present invention. Further, the scope of the technical spirit of the present invention is limited by the embodiments. The scope of the present invention shall be construed on the basis of the accompanying claims in such a manner that all of the technical ideas included within the scope equivalent to the claims belong to the present invention.

What is claimed is:

1. An organic light emitting display panel comprising:
a planarization layer positioned on a substrate including a plurality of pixels, and including a first opening portion formed in a non-emission area of the pixel;
a first electrode formed on a portion exposed through the first opening portion and the planarization layer;
a bank including a portion overlapping an edge of the first electrode, and exposing a portion corresponding to an emission area of the pixel on the first electrode;
an organic layer formed on the portion corresponding to the emission area of the pixel on the first electrode; and
a second electrode formed on the bank and the organic layer,
wherein the bank comprises:
a first bank that insulates the first electrode and the second electrode in the first opening portion in the non-emission area of the pixel; and
a second bank defining the emission area and including a second opening portion corresponding to the first opening portion in the non-emission area of the pixel.

2. The organic light emitting display panel of claim 1, wherein the organic layer is formed as a multi-layer structure including at least one layer, and at least one layer in the organic layer is formed by a solution process.

3. The organic light emitting display panel of claim 1, wherein the first bank is formed on the portion corresponding to the non-emission area of the pixel on the first electrode, and the second bank is formed on the first bank.

4. The organic light emitting display panel of claim 1, wherein the first bank is formed on a portion exposed through the first opening portion and the second opening portion.

5. The organic light emitting display panel of claim 1, further comprising:
a material which is hydrophobic on the second bank.

6. The organic light emitting display panel of claim 1, further comprising:
a transistor positioned between the substrate and the planarization layer,
wherein the first electrode is connected to a source electrode or a drain electrode of the transistor through the first opening portion.

7. The organic light emitting display panel of claim 3, wherein the first bank is formed of an inorganic material, and the second bank is formed of a photocurable organic material which is hydrophobic.

8. The organic light emitting display panel of claim 4, wherein the first bank is formed of a thermosetting organic material, and the second bank is formed of a photocurable organic material which is hydrophobic.

9. The organic light emitting display panel of claim 4, wherein the first bank is formed by a solution process.

10. A method of manufacturing an organic light emitting display panel, the method comprising:
forming a planarization layer including a first opening portion formed in a non-emission area of a pixel, on a substrate;
depositing a first electrode on the planarization layer and a portion exposed through the first opening portion;
depositing an inorganic material on the first electrode to form a first bank;
spreading a photocurable organic material which is hydrophobic on the first bank;
exposing and developing through a mask to expose a portion corresponding to an emission area of the pixel on the first electrode, and forming a second bank defining the emission area and including a second opening portion corresponding to the first opening portion in the non-emission area of the pixel;
printing an organic layer on the portion corresponding to the emission area of the pixel on the first electrode; and
depositing a second electrode on the organic layer, the first bank and the second bank,
wherein the first bank insulates the first electrode and the second electrode in the first opening portion in the non-emission area of the pixel.

11. A method of manufacturing an organic light emitting display panel, the method comprising:
forming a planarization layer including a first opening portion formed in a non-emission area of a pixel, on a substrate;
depositing a first electrode on the planarization layer and a portion exposed through the first opening portion;
spreading a photocurable organic material which is hydrophobic on the first electrode;
exposing and developing through a mask to expose a portion corresponding to an emission area of the pixel on the first electrode, and forming a second bank defining the emission area and including a second opening portion corresponding to the first opening portion in the non-emission area of the pixel;
printing an organic layer on the portion corresponding to the emission area of the pixel on the first electrode;
printing a first bank on a portion exposed through the first opening portion and the second opening portion; and
depositing a second electrode on the organic layer, the first bank and the second bank,
wherein the first bank insulates the first electrode and the second electrode in the first opening portion in the non-emission area of the pixel.

* * * * *